United States Patent [19]

Oppelt

[11] Patent Number: 4,926,147

[45] Date of Patent: May 15, 1990

[54] ARRANGEMENT FOR TUNING A BALANCED-TO-GROUND RESONATOR

[75] Inventor: Ralph Oppelt, Weiher, Fed. Rep. of Germany

[73] Assignee: Siemens Aktiengesellschaft, Berlin and Munich, Fed. Rep. of Germany

[21] Appl. No.: 330,360

[22] Filed: Mar. 29, 1989

[30] Foreign Application Priority Data

Apr. 11, 1988 [DE] Fed. Rep. of Germany ....... 3811984

[51] Int. Cl.$^5$ ................................................ H03J 3/20
[52] U.S. Cl. ...................................... 334/81; 334/82; 334/83; 361/299
[58] Field of Search .................................... 334/78–83; 361/299; 333/174

[56] References Cited

U.S. PATENT DOCUMENTS

| | | | |
|---|---|---|---|
| 1,866,456 | 7/1932 | Fichandler | 334/82 X |
| 1,987,124 | 1/1935 | Muller | |
| 2,028,596 | 1/1936 | Franklin et al. | 334/80 X |
| 2,075,957 | 4/1937 | Payne | 361/299 X |
| 2,400,897 | 5/1946 | Wachtman | 334/79 |

OTHER PUBLICATIONS

"Butterfly Oscillators as Detectors of Nuclear Quadrupole Resonance Signals," Butcher et al., J. Phys. E., Si. Instrum., vol. 12, No. 6, pp. 484–489 (1979).

"An Improved Saddle Coil for MR Imaging in Resistive Magnet System," Boornbos et al., Magnetic Resonance in Medicine, vol. 2, pp. 490–494 (1985).

*Primary Examiner*—Paul Gensler
*Attorney, Agent, or Firm*—Hill, Van Santen, Steadman & Simpson

[57] ABSTRACT

An apparatus for tuning a balanced-to-ground resonator, the resonator including at least one radio-frequency coil, the radio-frequency coil having an inductance forming a resonant circuit in combination with a capacitor, includes two identical differential capacitors which are mechanically coupled so that their respectively capacitances, during tuning, change in a balanced-to-ground fashion. In this tuning arrangement, the dependency of the frequency error on a change of the load of the resonator is negligibly small, so that a separate step or separate circuitry for undertaking frequency correction is not needed.

5 Claims, 1 Drawing Sheet

ARRANGEMENT FOR TUNING A BALANCED-TO-GROUND RESONATOR

BACKGROUND OF THE INVENTION

1. Field of the Invention

The present invention is directed to an arrangement for tuning a balanced-to-ground resonator wherein the resonator includes at least one radio-frequency coil having an inductance which forms the resonant circuit for the resonator in combination with a capacitance.

2. Description of the Prior Art

Devices are known for producing tomograms of an examination subject, such as a human body, using the phenomenon of nuclear magnetic resonance. These so called NMR tomography devices include a fundamental field magnet system which aligns the nuclear spins in the examination subject, and also include gradient coils which generate a spatially different magnetic field, and radio-frequency coils for exciting the nuclear spins and for receiving the signals emitted as a result of the exited nuclear spins. Given the use of such a radio-frequency excitation and measuring coil, the inductance of the coil is connected in parallel with a fixed capacitor as an LC resonant circuit, and another capacitor (or capacitor arrangement) is then tuned to bring the circuit to the desired frequency. The use of a variable capacitor connected in parallel with the coil inductance and a series capacitor connected in the feed line for coupling the resonator to a radio-frequency generator is known for this purpose. The radio-frequency generator is preferably an oscillator having a following transmission amplifier. It is known to use a rotary capacitor as the variable capacitor, the capacitance of such an rotary capacitor being controlled by an electric motor, as described in Magnetic Resonance in Medicine 2 (1985), pages 490–494.

Depending upon the size of the examination subject, for example, a patient, the resonator is loaded to different degrees, i.e., damped. When matching the resonator to the radio-frequency source, which may have a characteristic impedance of for example, 50 ohms, one obtains matching frequencies which are dependent upon the degree of loading of the resonator. The natural frequency of the resonator must be detuned so that the frequency error caused by the different loading of the resonator is again compensated. After introduction of a patient into the nuclear magnetic resonance tomography device, tuning of the resonator is undertaken for this purpose by successively adjusting both the series capacitor for load matching and the parallel capacitor for frequency correction, until the required tuning is achieved.

It is known to use a differential rotary capacitor for tuning the resonator.

A structural embodiment of a capacitor for tuning an unbalanced-to-ground resonant circuit is described in U.S. Pat. No. 1,987,124. This structure includes two stacks of stator or fixed plates which are arranged side-by-side along the axial direction of a rotor shaft. As the shaft rotates, moveable or rotor plates are moved between the stator plates. The spacing in the stack of stator plates must be selected relatively large so that the residual capacitance between the two capacitors is maintained low. This residual capacitance reduces the range of variability in capacitances achievable by this structure.

SUMMARY OF THE INVENTION

It is an object of the present invention to provide a balance-to-ground resonator matched to the impedance of its radio-frequency source wherein the dependency of the frequency error on a change in the resonator load is sufficiently negligible such that separate frequency correction measures are not needed.

The above object is achieved in accordance with the principles of the present invention in a resonator wherein the capacitance in the resonant circuit is formed by two differential rotary capacitors which can be tuned in common.

The differential rotary capacitors may each consist of a rotary capacitor having stator plates offset by 180° relative to each other and having rotor plates consisting of semi-circular discs having a pivot point at the center of the circle, and being mechanically connected to a shaft coincident with the rotational axis.

DESCRIPTION OF THE PREFERRED EMBODIMENTS

Figure 1:
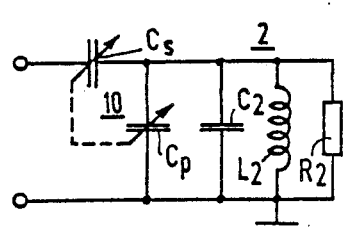
FIG. 1 is a circuit diagram of a known arrangement for tuning a resonator.

In the known circuit for tuning an unbalanced-to-ground resonator shown in FIG. 1, a radio-frequency coil $L_2$, for example the antenna of a nuclear magnetic resonance tomography apparatus, forms a resonator 2 in combination with a capacitor $C_2$. The radio-frequency losses which arise due to the ohmic resistance of the coil itself, and due to the interaction of the magnetic and electrical radio-frequency coil fields with the body tissue of the patient, as well as due to emission, are referenced $R_2$ in FIG. 1. A variable capacitor $C_p$ and a series capacitor $C_s$ are provided for tuning. The parallel capacitor $C_p$ and the series capacitor $C_s$ form a differential rotary capacitor 10.

Figure 2:
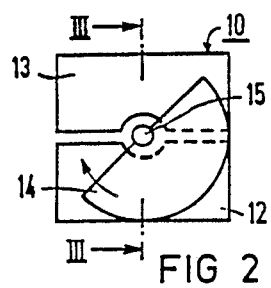
FIG. 2 is a plane view of a portion of a known differential rotary capacitor useable for tuning the circuit shown in FIG. 1.

A known structure for such a differential rotary capacitor 10 is shown in FIG. 2. This structure includes two stacks of stator plates 12 and 13 disposed opposite each other. The stator plates 12 and 13 in combination with moveable rotor plates 14 form the differential capacitor. The rotor plates 14 are seated on a common shaft 15 coincident with the rotational axis, for rotation about the axis.

Figure 3:
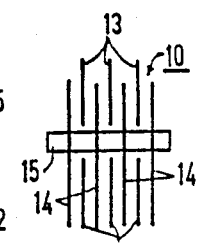
FIG. 3 is a sectional view of the known rotary capacitor of FIG. 2 taken along line III—III.

As shown in FIG. 3, the rotor plates 14 are disposed along the shaft 15 between the stator plates 12 and 13, so that they can be moved from one extreme position to another extreme position by rotation of the shaft 15. The plates 12 and 13, and the shaft 15, are each provided with an electrical connecting lead which is not shown in the drawing.

The structure shown in FIGS. 2 and 3 provides a capacitor having a capacitance depending upon the position of the rotor plates 14 relative to the stator plates 12 and 13.

Figure 4:
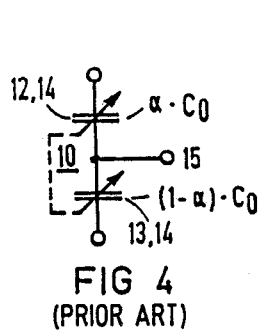
FIG. 4 is an equivalent circuit diagram of the known differential rotary capacitor shown in FIGS. 2 and 3.

A differential rotary capacitor 10, wherein the capacitance of one capacitor is referenced $\alpha C_0$ and the capacitance of the other capacitor is referenced $(1-\alpha)C_0$ is obtained with a standardized rotation angle $\alpha$ according to the equivalent circuit diagram shown in FIG. 4. In one extreme position, wherein the rotor plates 14 entirely overlap the stator plates 12, the capacitor formed between the plates 12 and 14 has a capacitance $C_0$, and the capacitance of the other capacitor formed between the plates 13 and 14 is zero. With movement of the rotor plates 14, the capacitance between the plates 12 and 14 decreases and the capacitance between the plates 13 and 14 correspondingly increases, until at the other extreme position the capacitor formed between the plates 13 and 14 reaches the capacitance $C_0$. The rotor plates 14 are electrically connected to each other, with this electrical connection being tapped at terminal 16, which may be taken through the shaft 15.

Figure 5:
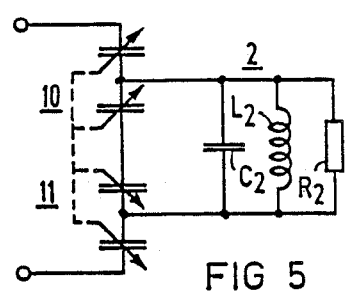
FIG. 5 is a circuit diagram for tuning a balanced-to-ground resonator constructed in accordance with the principles of the present invention.

In the embodiment of FIG. 5 constructed in accordance with the principles of the present invention, a balanced-to-ground resonator 2 is shown having an inductance $L_2$, a resistor $R_2$ and a resonator capacitor $C_2$. The resonator is connected across an energy source (not shown in FIG. 5) via two differential rotary capacitors 10 and 11. The two differential rotary capacitors 10 and 11 are structurally identical, and are mechanically coupled so that a correspondingly oppositely directed modification of the capacitances is obtained for tuning the balanced-to-ground resonator 2. The taps from the rotary capacitors 10 and 11 which are connected to the resonator 2 each correspond to the tap 16 in FIG. 4.

As schematically indicated in FIG. 5, the two differential rotary capacitors 10 and 11 can each be provided with an electrical drive. The two drives may be electrically coupled so that the respective capacitances of the rotary capacitors 10 and 11 change in a balanced-to-ground fashion.

In a further embodiment, a combination of capacitors can be provided having a total capacitance with at least a portion of the total capacitance being variable. These capacitors are driven so that the change in their capacitance simulates two coupled differential rotary capacitors. The coupling of the capacitors may be mechanical, or may be also undertaken by a corresponding electrical drive.

Figure 6:
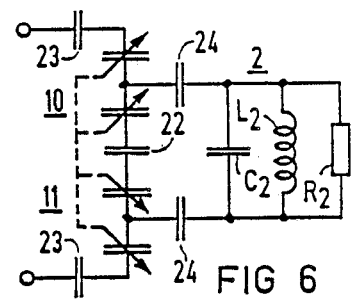
FIG. 6 is a circuit diagram of a further embodiment of an arrangement for tuning a balanced-to-ground resonator constructed in accordance with the principles of the present invention.

A further reduction in the frequency dependency is obtained in the embodiment of the invention shown in FIG. 6, wherein a further capacitor 22 is interconnected between the two differential rotary capacitors 10 and 11. An even further reduction of the frequency dependency is obtained by interconnecting a respective feed capacitor 23 in each of the two feed lines. A still further reduction in the frequency dependency can be obtained by interconnecting additional capacitors 24 respectively between the differential rotary capacitors 10 and 11 and the resonator 2. Under certain circumstances, it may be sufficient to use only the capacitors 23 or only the capacitors 24 instead of the capacitor 22. It may also be suitable under certain circumstances to use only the capacitors 23 in combination with the capacitor 22, or only the capacitors 24 in combination with the capacitor 22.

Figure 7:
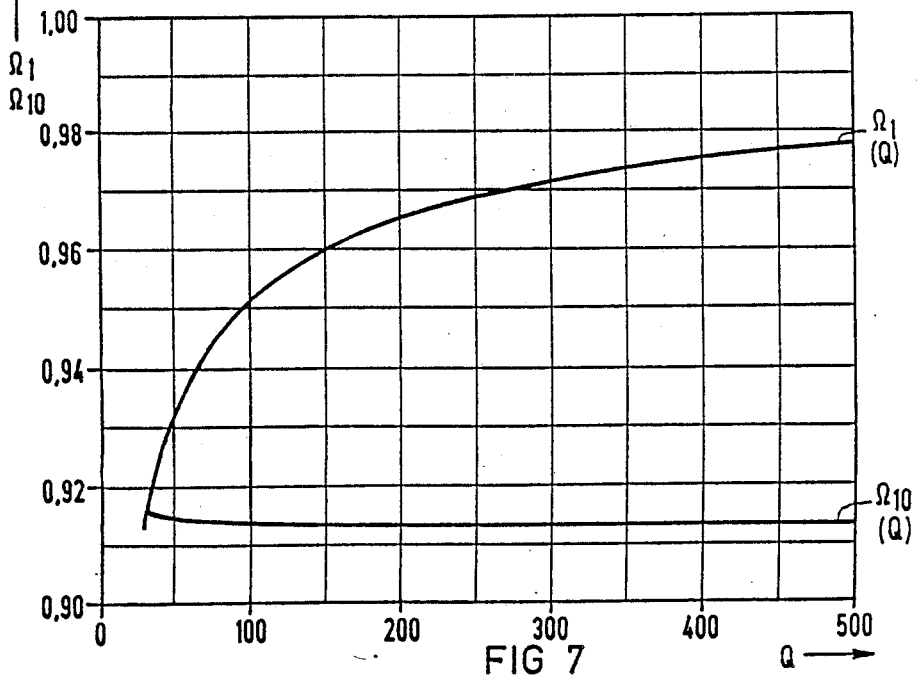
FIG. 7 is a graph showing the improvement in operation achieved by the arrangement for tuning a balanced-to-ground resonator constructed according to the principles of the present invention in comparison to a known arrangement.

The graph shown in FIG. 7 illustrates the standardized radian frequency $\Omega$ dependent on the quality Q of the resonant circuit. In the prior art circuit, if only one series capacitor $C_s$ were used without the parallel capacitor $C_p$ = (i.e., $C_p = 0$) only the series capacitor $C_s$ need be matched to the load. In this prior art circuit, the matching frequency $\Omega_1$ standardized to $$(L_2 C_2)^{-\frac{1}{2}}$$

derives as a function of the quality Q:

$$\Omega_1(Q) = [\Delta - (\Delta^2 - 1)^{\frac{1}{2}}]^{\frac{1}{2}}$$

wherein $$\Delta = 1 + Z_k/2Q - \tfrac{1}{2}Q^2,$$

wherein $$Q = R_2 (L_2/C_2)^{-\frac{1}{2}}$$

is the quality and $$Z_k = (L_2/C_2)^{\frac{1}{2}}/Z$$

is the characteristic impedance of the resonant circuit standardized to the source impedance Z.

The lowest quality Q at which matching is still possible is fixed by the maximum value of the series capacitor $C_s$.

As shown in FIG. 7, the standardized matching frequency $\Omega_1$ in this known arrangement changes by approximately 4.5% in the range of $50 \leq Q \leq 500$.

Using a differential rotary capacitor 10 connected to the resonator 2, by contrast, a standardized matching frequency $\Omega_{10}$ is obtained as a function of the quality Q:

$$\Omega_{10}(Q) = \frac{1 + [4Q^2(1 + c_0)(Qz_k - 1) + 1]^{\frac{1}{2}}}{2Q(Qz_k - 1)^{\frac{1}{2}}(1 + c_0)}$$

wherein $c_0 = C_0/C_2$ is the capacitance ratio of $C_0$ to $C_2$. The lowest quality at which matching is still possible is established by the condition $\alpha \leq 1$. For a calculated $Q_{10}(Q)$, a check must be undertaken to determine whether $$c_0 \Omega_{10}(Q)[Q^{-1}(Qz_k - 1)^{\frac{1}{2}} - \Omega_{10}(Q)] \geq 1$$

is still valid. It can be derived from the curve of the function $\Omega_{10}(Q)$ that the limit value $(1 + c_0)^{-\frac{1}{2}}$ is established for $\Omega_{10}$ with increasing quality Q. The graph of FIG. 7 shows the significantly flatter curve of the function $\Omega_{10}(Q)$ in comparison to $\Omega_1(Q)$. The ratio $c_0$ was assumed to be 0.2 and the standardized characteristic impedance of the resonant circuit was again selected as $Z_k = 1$. The standardized matching frequency $\Omega_{10}$ only now changes only by about 0.1% in the illustrated range $50 \leq Q \leq 500$.

Although modifications and changes may be suggested by those skilled in the art it is the intention of the inventor to embody within the patent warranted hereon all changes and modifications as reasonably and properly come within the scope of his contribution to the art.

I claim as my invention:

1. An arrangement for tuning a balanced-to-ground resonator, said resonator consisting of a capacitor and at least one radio-frequency coil having an inductance forming a resonant circuit with said capacitor, said resonator having two feed lines, said arrangement comprising two identical differential rotary capacitors each having a rotor plate accessible for electrical connection, said rotor plates being respectively connected to said feed lines and connected to each other, and means connected in common to said differential rotary capacitors for varying the respective capacitances of said differential rotary capacitors in a balanced-to-ground fashion.

2. An arrangement as claimed in claim 1, wherein each of said differential rotary capacitors comprises:

two stacks of spaced stator plates disposed perpendicular to a rotational axis and being disposed opposite each other on said rotational axis; and a common stack of said rotor plates each in the shape of a semi-circular disk and attached for pivoting around said rotational axis so as to be moveable between said stator plates.

3. An arrangement as claimed in claim 1, further comprising a capacitor connected between said differential rotary capacitors.

4. An arrangement as claimed in claim 1, further comprising two additional capacitors respectively connected in said feed lines preceding said differential rotary capacitors.

5. An arrangement as claimed in claim 1, further comprising two additional capacitors respectively connected in said feed lines between said differential rotary capacitors and said resonator.

* * * * *